(12) United States Patent
Tian et al.

(10) Patent No.: US 6,524,956 B1
(45) Date of Patent: Feb. 25, 2003

(54) METHOD FOR CONTROLLING THE GRAIN SIZE OF TUNGSTEN FILMS

(75) Inventors: Jason Tian, Milpitas, CA (US); Jon Henri, Linn, OR (US)

(73) Assignee: Novelius Systems, Inc., San Jose, CA (US)

( * ) Notice: Subject to any disclaimer, the term of this patent is extended or adjusted under 35 U.S.C. 154(b) by 38 days.

(21) Appl. No.: 09/668,217

(22) Filed: Sep. 22, 2000

Related U.S. Application Data

(60) Provisional application No. 60/155,941, filed on Sep. 24, 1999.

(51) Int. Cl.[7] .............................................. H01L 21/44
(52) U.S. Cl. ...................... 438/685; 438/648; 438/656; 438/680; 438/675; 438/462; 438/582; 438/401
(58) Field of Search .................................. 438/685, 648, 438/656, 680, 675, 462, 582, 401

(56) References Cited

U.S. PATENT DOCUMENTS

| | | | |
|---|---|---|---|
| 4,851,369 A | * 7/1989 | Ellwanger et al. .......... 437/200 |
| 5,272,112 A | 12/1993 | Schmitz et al. ............. 437/192 |
| 5,407,698 A | * 4/1995 | Emesh ......................... 427/99 |
| 5,599,739 A | * 2/1997 | Merchant et al. ........... 437/190 |
| 5,795,824 A | 8/1998 | Hancock ..................... 438/656 |
| 5,804,249 A | * 9/1998 | Sukharev et al. ............. 427/99 |
| 5,956,609 A | 9/1999 | Lee et al. ................... 438/627 |
| 6,060,787 A | * 5/2000 | Zhao et al. ................. 257/797 |
| 6,066,366 A | * 5/2000 | Berenbaum et al. ........ 427/250 |

* cited by examiner

*Primary Examiner*—Carl Whitehead, Jr.
*Assistant Examiner*—Khanh B. Duong
(74) *Attorney, Agent, or Firm*—Skjerven Morrill LLP

(57) ABSTRACT

A chemical vapor deposition process for depositing tungsten films having small grain size is provided. The process involves depositing a nucleation layer having very small nuclei that are closely spaced so that there are few vacancies on the surface. Such a nucleation layer results in a film with small grains after the subsequent deposition of bulk layers. The temperature of the substrate can be increased during deposition of the nucleation layer and then lowered for deposition of the bulk layer to produce a small grain tungsten film. Additionally, the thickness of the nucleation layer can be controlled, and the deposition chamber pressure and silage flow rates can also be controlled to achieve the desired nucleation layer before deposition of the bulk layers.

17 Claims, 5 Drawing Sheets

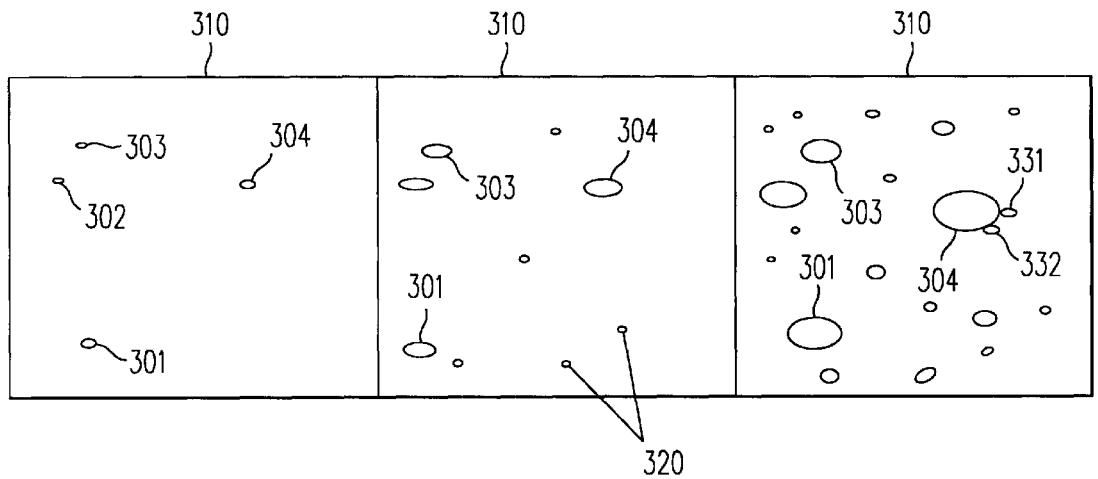
FIG. 3A
(Prior Art)
FIG. 3B
(Prior Art)
FIG. 3C
(Prior Art)
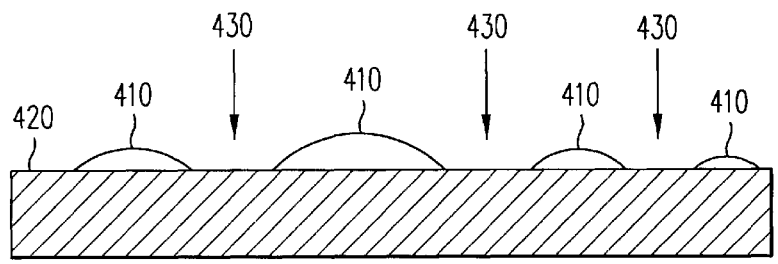
FIG. 4A
(Prior Art)
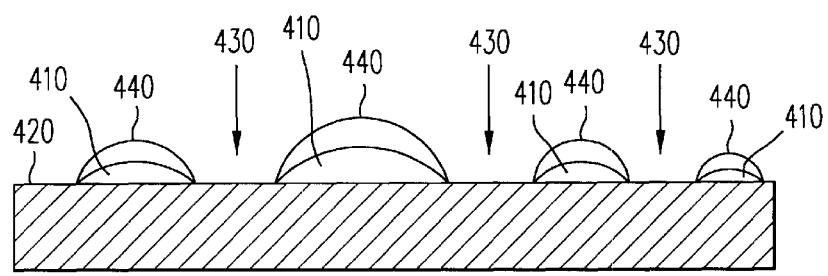
FIG. 4B
(Prior Art)

METHOD FOR CONTROLLING THE GRAIN SIZE OF TUNGSTEN FILMS

RELATED APPLICATION

This application claims benefit of U.S. Provisional Application No. 60/155,941, filed Sep. 24, 1999, incorporated herein by reference in its entirety.

BACKGROUND

1. Field of the Invention

This invention relates generally to the chemical vapor deposition of tungsten in the fabrication of microelectronic devices, and more specifically to methods for controlling the grain size of the tungsten films.

2. Description of the Related Art

Tungsten is widely used in microelectronic devices to provide electrical connection between device elements. Tungsten films are deposited on semiconductor substrates to fill contact and via holes and to form interconnect lines. In device fabrication, chemical vapor deposition (CVD) is used to form tungsten films through the reduction of tungsten hexafluoride ($WF_6$) by hydrogen ($H_2$) or silage ($SiH_4$). It is common for the semiconductor substrate to have device features already patterned onto the substrate before the tungsten is deposited. To prevent unwanted deterioration of these features, and to prevent diffusion of the tungsten into the substrate, the tungsten layer is typically deposited using low temperatures, generally below 400° C.

Because tungsten does not bond well to silicon or silica based insulating layers, a thin adhesion layer of titanium or titanium nitride is often first deposited onto the substrate to improve tungsten adhesion. Tungsten is typically deposited onto the adhesion layer using two or more discrete stages, as described in U.S. Pat. No. 5,795,842 to Hancock, U.S. Pat. No. 5,407,698 to Emesh, and U.S. Pat. No. 5,956,609 to Lee et al. In a first stage, a thin nucleation layer, also called the glue layer, is deposited, usually by the reduction of tungsten hexafluoride by silage. The nucleation layer further improves the adhesion of tungsten to the substrate surface. After deposition of the nucleation layer is complete, bulk layers of tungsten are subsequently deposited over the nucleation layer to grow the tungsten film to the desired thickness. Typically, the bulk layers are formed by reduction of tungsten hexafluoride by hydrogen.

As device dimensions shrink, so do the size and aspect ratios of the device features that the tungsten film must cover. The challenge is to fill these small features with tungsten completely, without leaving voids or seams in the tungsten layer, which can diminish device performance.

As illustrated by comparison of FIG. 1A to FIG. 1B, the minimum dimension of a gap 100 that can be filled without voids 102 is determined by the size of the grains 110 of tungsten that form the film. In FIG. 1B, the smaller grains 110 result in fewer and smaller voids 102. The grains 110 are crystals of tungsten that grow during the deposition process, and are typically shaped as columns that grow in the direction of the crystal. Voids 102 and seams form when two or more individual crystals grow until their boundaries reach each other without filling all of the space in between them. Hence, by reducing the tungsten film grain size, smaller features can be filled.

Previous methods for decreasing tungsten grain size have included using a low $WF_6$ flow rate, using a low deposition temperature (400° C. or below), and using a high chamber pressure (for example, approximately 100 Torr).

SUMMARY

A process is provided for depositing a tungsten film having a small grain size on a semiconductor substrate. The process is suitable for use in filling contact and via holes on the substrate which are very small and have high aspect ratios while avoiding the problem of voids and seams. The process is also suitable for depositing smooth tungsten films to be patterned into interconnect lines.

In the embodiments of the invention, the nucleation layer is deposited such that the nuclei clusters that form the layer are small and have a high density, to provide high surface coverage of the substrate surface with few vacancies. The subsequently deposited bulk tungsten layer has a reduced grain size.

In one example, a tungsten film having a mean grain size of less than 145 nm can be deposited on a substrate by depositing a nucleation layer with a mean nuclei cluster size of less than 100 nm and depositing bulk layers over the nucleation layer. The nucleation layer controls the grain size of the tungsten film.

Various process parameters are used to deposit a nucleation layer having small, densely packed nuclei that results in a tungsten film having a small grain size.

In one method, the temperature of the substrate is raised to over 400° C. for deposition of the nucleation layer, while deposition of the subsequent bulk layer is accomplished at substrate temperatures below 400° C.

In one method, the thickness of the nucleation layer is controlled to be no more than approximately 600 Å thick, typically between 150 Å and 530 Å thick.

In one method, the flow rate of $SiH_4$ is between 35 sccm and 80 sccm, typically 45 sccm, during the nucleation layer deposition, so that the ratio of $WF_6$:$SiH_4$ flow rates during deposition of the nucleation layer is in the range of 1:1 to 17:1, typically 9:1.

In one method, the pressure of the deposition chamber is maintained at between 40 and 80 Torr, typically 60 Torr for deposition of the nucleation layer. The subsequent bulk layer is deposited at a pressure of 40 Torr.

BRIEF DESCRIPTION OF THE DRAWINGS

FIGS. 3A, 3B, and 3C illustrate stages in the formation of a nucleation layer illustrating the growth of nuclei clusters.

FIG. 4A is a cross-sectional side view of a nucleation layer on a substrate surface illustrating vacancies between the nuclei clusters.

FIG. 4B is the cross-sectional side view of FIG. 4A with a bulk tungsten layer formed on the nucleation layer.

DETAILED DESCRIPTION

The inventors have identified that the grain size in a tungsten film can be controlled by controlling the size and density of nuclei clusters deposited in the nucleation layer. The results of their investigation on the effects of the nucleation layer on bulk film grain growth are reported in the article "The Effect of Nucleation On Bulk W Film Grain Size Reduction" (Novellus Systems, Inc. internal document), incorporated herein by reference in its entirety.

Figure 1A:
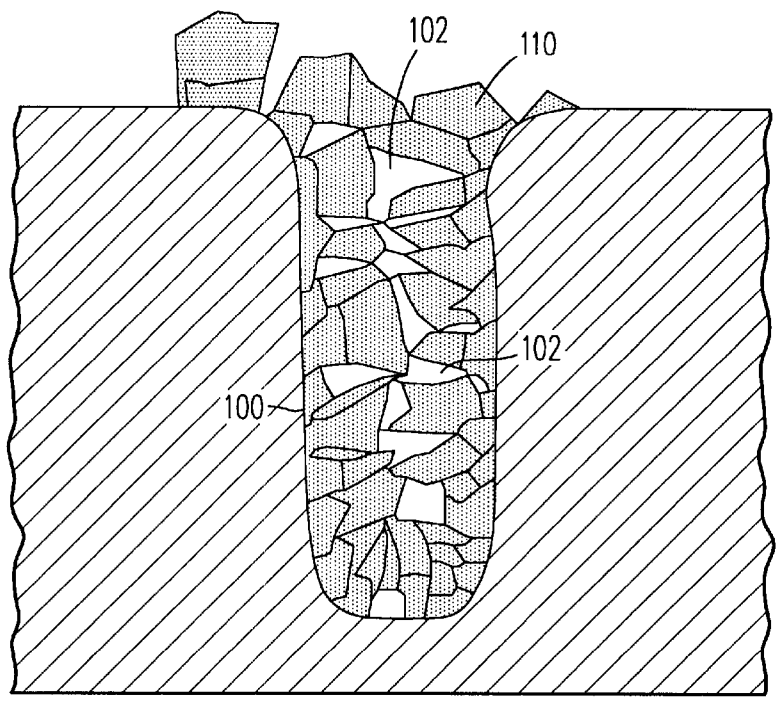
FIGS. 1A and 1B are cross-sectional side views illustrating gaps filled with a tungsten film. The grain size of the tungsten film in FIG. 1A is larger than the grain size of the tungsten film in FIG. 1B.
Figure 1B:
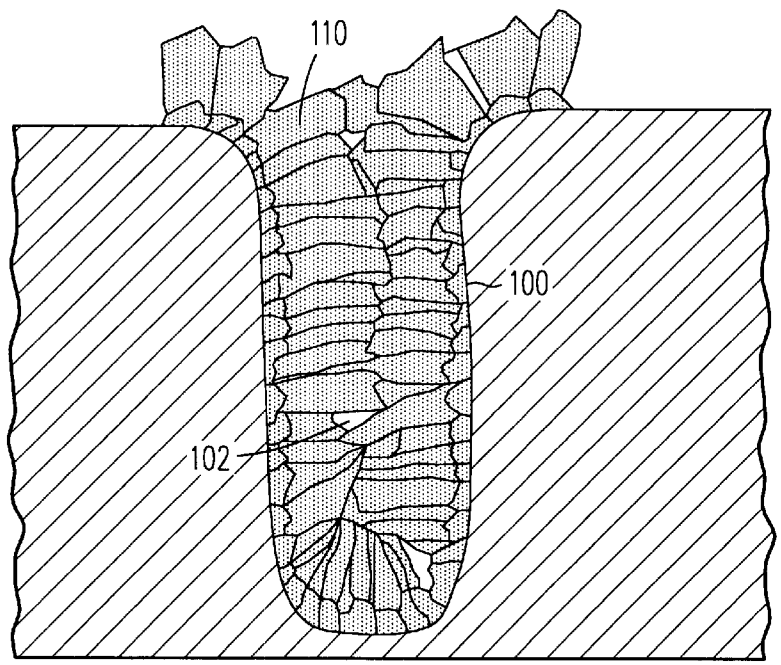
Figure 2:
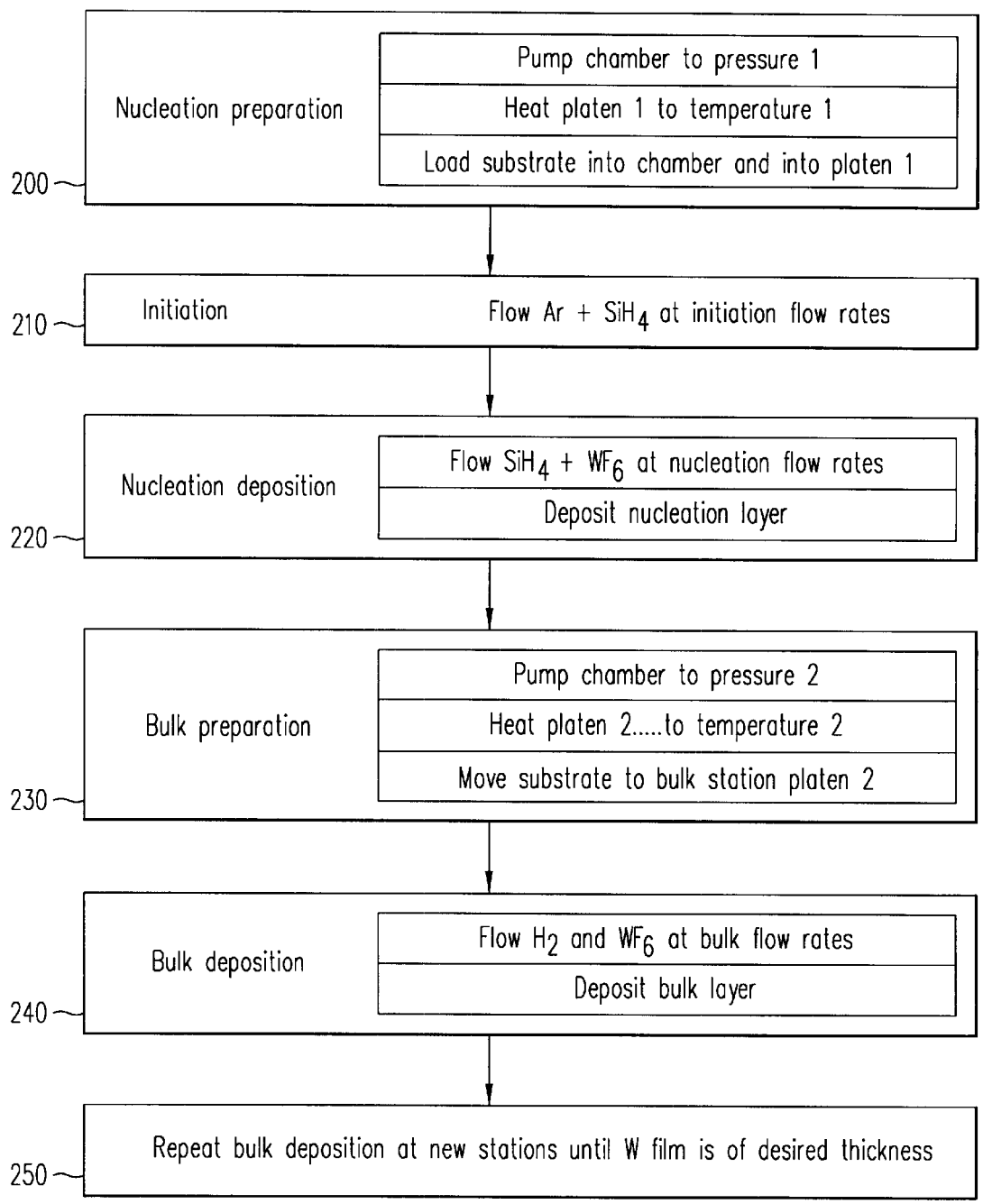
FIG. 2 is a prior art process sequence for chemical vapor deposition of a tungsten film.

FIG. 2 outlines a general CVD process for depositing tungsten on a semiconductor substrate. The process can be applied, for example, using the apparatus and methods described in U.S. Pat. No. 5,795,824, incorporated herein by reference in its entirety. Table 1 lists a set of conventional process conditions for depositing a nucleation layer and bulk layers using the process sequence of FIG. 2.

TABLE 1

Conventional process parameters for deposition of tungsten films

| Nucleation preparation | |
| --- | --- |
| Pressure 1: | 40 Torr |
| Temperature 1: | 350° C. |
| Initiation | |
| Front Ar flow rate: | 1,000–15,000 sccm (typically 9,000 sccm) |
| Back Ar Flow rate: | 4,000–12,000 sccm (typically 8,000 sccm) |
| Front $H_2$ flow rate: | 2,000–10,000 sccm (typically 10,000 sccm) |
| Back $H_2$ flow rate: | 10,000–20,000 sccm (typically 15,000 sccm) |
| Time: | typically 15 seconds |
| Nucleation Deposition | |
| $SiH_4$ flow rate: | 20 sccm |
| $WF_6$ flow rate: | 100 to 600 sccm (typically 400 sccm) |
| Front $H_2$ flow rate: | 2,000–10,000 sccm (typically 10,000 sccm) |
| Back $H_2$ flow rate: | 10,000–20,000 sccm (typically 15,000 sccm) |
| Time: | typically 10 seconds |
| Bulk Preparation | |
| Pressure 2: (the same as Pressure 1) | 40 Torr |
| Temperature 2: (the same as Temperature 1) | 350° C. |
| Bulk Deposition | |
| Front $H_2$ flow rate: | 2,000–10,000 sccm (typically 10,000 sccm) |
| Back $H_2$ flow rate: | 10,000–20,000 (typically 15,000 sccm) |
| $SiH_4$ flow rate: | 15–45 sccm (typically 20 sccm) |
| $WF_6$ flow rate: | 100–600 sccm (typically 400 sccm) |
| Time: | depends on desired thickness of film |

In the preparation stage 200, the substrate is placed on a support within a deposition chamber. The chamber is sealed and pumped to a predetermined pressure, pressure 1. The substrate is heated to a desired temperature by heating the support or platen on which the substrate rests to a predetermined temperature (temperature 1 in Table 1).

Initiation gases hydrogen ($H_2$) and silage ($SiH_4$) are then supplied at initiation stage 210 to the chamber and directed at the wafer at predetermined initiation flow rates. During the initiation stage silage is adsorbed onto the substrate to protect the substrate from potential damage in subsequent reactions.

In the deposition 220 of the nucleation layer, the nucleation gases tungsten hexafluoride ($WF_6$) and silage ($SiH_4$) are introduced into the chamber at predetermined nucleation flow rates. Hydrogen ($H_2$) may also be introduced into the chamber during deposition of the nucleation layer.

To prepare for the deposition 230 of the bulk layer (or layers), the substrate is moved to a second support, which is also heated. Conventionally, the substrate is heated to the same temperature for deposition of the bulk layer as was used for deposition of the nucleation layer, and temperature 1 is equal to temperature 2. In conventional practice, the pressure of the chamber during bulk deposition is also typically the same pressure as was used in the nucleation layer deposition (pressure 1=pressure 2).

Bulk tungsten is deposited 240 using tungsten hexafluoride ($WF_6$) and hydrogen ($H_2$) gases, which enter the chamber at predetermined flow rates.

To grow a tungsten film to a desired thickness, the wafer may be moved to additional bulk deposition stations which each have platens for supporting and heating the substrate, and the process sequence 230 and 240 is repeated (250) until the desired film thickness is reached.

Stages in the growth of the nucleation layer over time using a conventional nucleation layer deposition process are illustrated in FIGS. 3A, 3B, and 3C, which shows nuclei clusters 301, 302, 303,304 of the nucleation layer on a substrate 310. The illustration is based on scanning electron microscope images (not shown) taken of a nucleation layer deposited using the process 200, 210, and 220 of FIG. 2 and conventional process conditions, such as those listed in Table 1.

Exemplary nuclei clusters 301, 302, 303, and 304 first deposited onto the substrate 310 (FIG. 3A) continue to grow throughout the deposition (FIG. 3B then FIG. 3C), becoming larger than the subsequently deposited nuclei clusters, for example nuclei clusters 320. The initially deposited nuclei clusters 301, 302, 303, and 304 grow not only in the vertical direction, away from the substrate 310, but also spread parallel to substrate 310. As the nucleation layer deposition continues, the nuclei clusters may coalesce to form even larger clusters, as exemplified by nuclei clusters 304,331, and 332 in FIG. 3C. When nucleation ends, the nuclei clusters in the nucleation layer have varying sizes, some large (for example 301, 302, 303, and 304). When the subsequent bulk layer is deposited over the nucleation layer, the larger nuclei cause larger grains to grow in the bulk deposition.

A side view, FIG. 4A, of a nucleation layer such as that illustrated in FIGS. 3C, illustrates another source of large grains and of voids or seams that originate with the nucleation layer. When the nuclei 410 in the nucleation layer do not completely cover the substrate surface 420, vacancies 430 are left on the surface. As shown in FIG. 4B, in subsequent bulk layer 440 depositions these vacancies 430 may be left unfilled, because the substrate surface, typically TiN, does not favor $WF_6$ reduction by $H_2$ (used for bulk layer deposition). The vacancies 430 leave room on the surface for the grains to grow large and cause voids.

Figure 5:
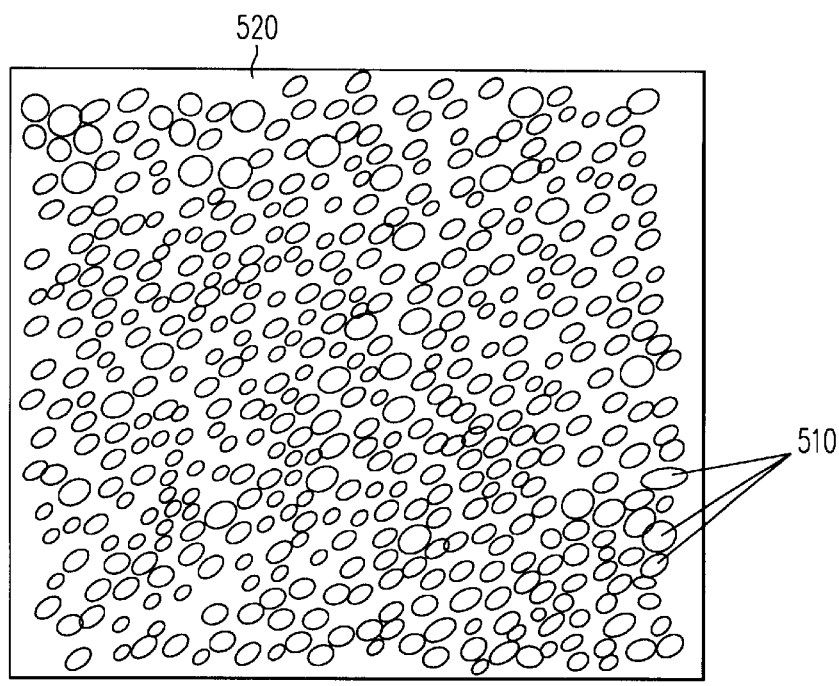
FIG. 5 illustrates a nucleation layer having small, closely spaced nuclei clusters.

A tungsten film that has small grains and few voids can, therefore, be obtained by depositing a nucleation layer that has a high density of uniformly sized, small nuclei clusters and a high degree of substrate surface coverage with few vacancies. FIG. 5 is a diagram of an example of such a nucleation layer. Small nuclei clusters 510 densely cover the substrate surface 520. Typically, the nuclei clusters have a mean size of less than 100 nm, where nuclei size is determined by the longest dimension of a nuclei cluster. In the embodiments of the invention, the nucleation layer is deposited such that small nuclei clusters densely cover the substrate surface, leaving few vacancies and resulting in a bulk tungsten layer with smaller grain size.

Figure 6:
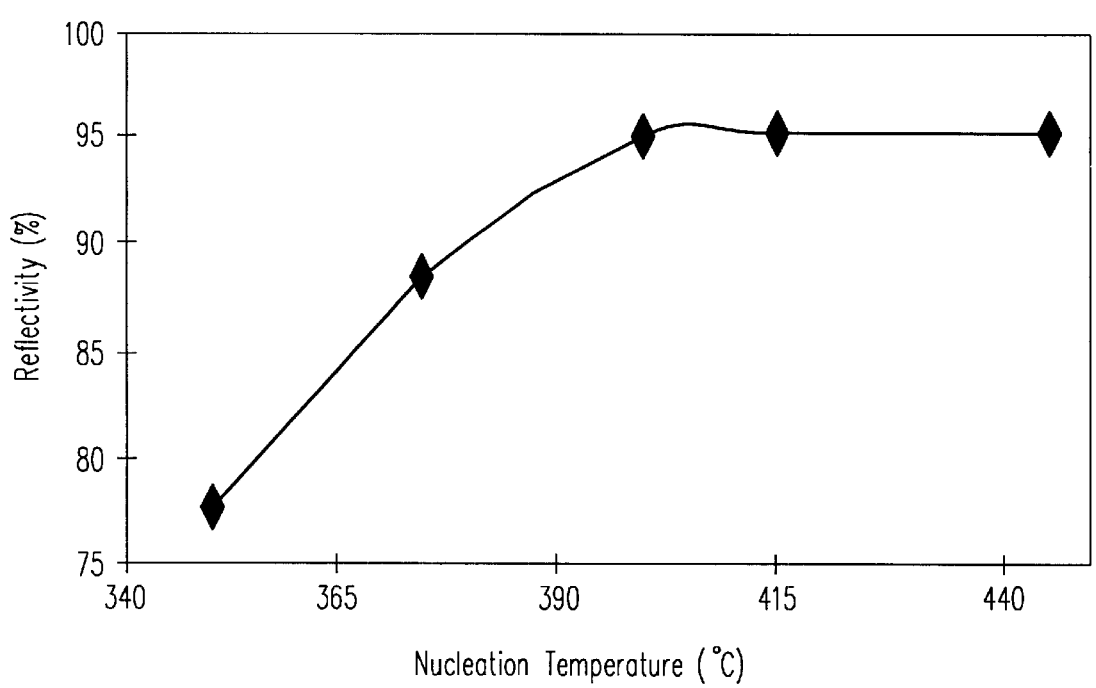
FIG. 6 is a graph of the reflectivity of tungsten films as a function of the temperature of the substrate for deposition of the nucleation layer.

In one embodiment, the substrate temperature for deposition of the nucleation layer (temperature 1) is raised above 400° C., typically to between 400° C. and 445° C., for example to 415° C. FIG. 6 illustrates the results of increasing the substrate temperature for nucleation layer deposition while leaving the substrate temperature for bulk deposition constant at 350° C. Reflectivity, which is a function of grain size and increases as grain size decreases, was measured on 5000 Å tungsten films. The films were deposited using the process conditions of Table 1, with the exception of the substrate temperature used for the nucleation deposition (temperature 1), which was held at 415° C. Temperature 2, the temperature for bulk layer deposition remained at 350° C. FIG. 6 shows that using a higher temperature for deposition of the nucleation layer reduces the tungsten grain size. This is an unexpected result, as grain size generally decreases with decreasing deposition temperatures for bulk layer deposition processes.

Although the present invention is not limited by any theory, the nucleation rate can be estimated based on the formula:

$$J = KrPT^{0.5} \exp(-B/RT) \qquad \text{Equation 1}$$

Where K is a proportionality constant, r is a critical nucleus radius, P is pressure, T is substrate temperature, and B is a combination of surface energies. From equation 1, the nucleation rate can be altered by changing the temperature, pressure, critical nucleus radius (affected by how clean the surface is) and surface energies. Thus, the increased temperature may increase the nucleation rate, producing the desired nucleation layer.

In the example of FIG. 6, the temperature used for bulk layer deposition was 350° C. In general, the bulk deposition temperature is below 400° C., typically at a temperature of about 375° C.

In addition to temperature, other process parameters, such as deposition time, pressure, and flow rate, can be used to obtain a nucleation layer that has a high density of uniformly sized, small nuclei clusters, as described below. In general, any combination of parameters that results in a nucleation layer, such as that illustrated in FIG. 5, in which the mean size of the nuclei clusters is less than 100 nm can be used to produce a tungsten film with small grain size.

For a given deposition rate, the deposition time controls the thickness of the nucleation layer. Conventionally, the process parameters listed in Table 1, with a standard deposition time of 10 seconds, results in a nucleation layer with a thickness typically 600 Å or greater. The inventors have found that a tungsten film with small grains and few voids can be achieved by depositing a thinner nucleation layer, less than approximately 600 Å thick and typically in the range of 150 Å to 530 Å thick. Controlling the nucleation layer to this thickness is believed to reduce the number of vacancies between nuclei in the deposited nucleation layer and, hence, reduce grain size of the bulk layer. Deposition times used to achieve the thinner nucleation layers depend on the deposition rate, which depends on the parameters of equation 1. For temperatures above 400° C., shorter duration times, in the range of 2 to 10 seconds, for example 3 seconds, are used.

The pressure can also be used to control the size and density of nuclei clusters in the nucleation layer. The pressure in the chamber is increased above the conventional 40 Torr, to a pressure between 40 and 80 Torr, for example 60 Torr. The higher pressure results in smaller nuclei clusters deposited in the nucleation layer and also decreases surface vacancies. While the present invention is not limited to any theory of operation, it is believed that the high pressure gives a short mean free path for the gas molecules, therefore increasing the impingement rate and density of surface nuclei coverage. A trade-off for increasing total pressure is an increase in the likelihood of gas phase nucleation, which can lead to incorporation of particles formed in the gas phase into the deposited film. For deposition of the bulk layer, the total pressure is typically reduced back to 40 Torr.

The flow rate of the $SiH_4$ can also be increased above the conventional 20 sccm, to between 35 sccm and 80 sccm, typically 45 sccm, to produce a nucleation layer with the desired properties. Increased $SiH_4$ flow rate results in reduced nuclei size but can also increase undesirable gas phase nucleation effects. The ratio of $WF_6$ : $SiH_4$ partial pressures in this embodiment is in the range of 1:1 to 17:1, typically 9:1.

Figure 7:
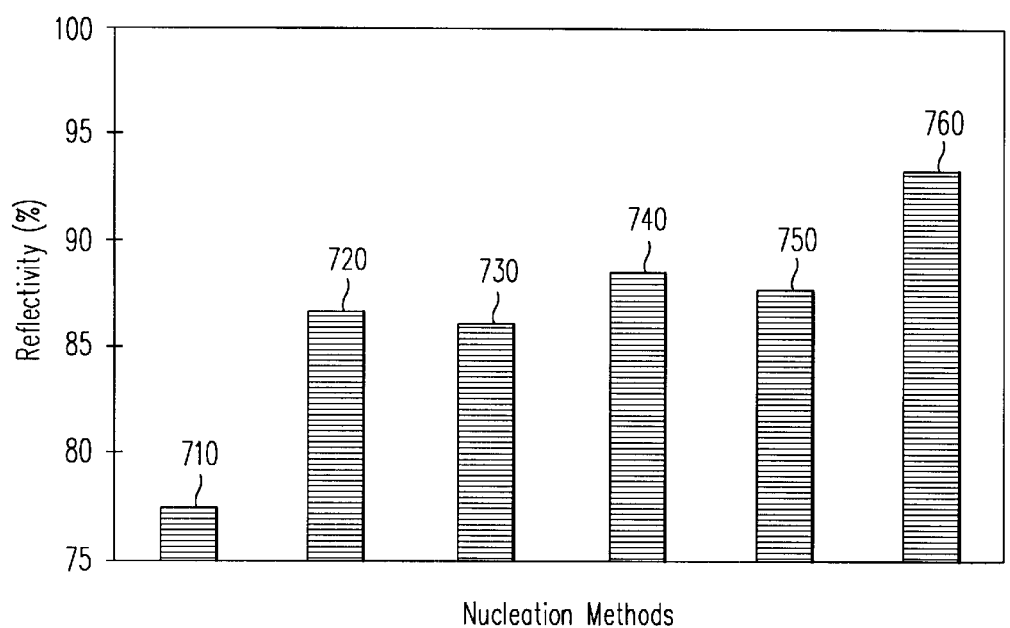
FIG. 7 is a bar chart of the reflectivity of tungsten films deposited using the different process conditions of the embodiments of the invention.

FIG. 7 is a bar graph of the reflectivity of 5000 Å tungsten films deposited using the various processes of the embodiments. For comparison, the reflectivity was measured, result 710, on a film deposited by the conventional process, using the parameters listed in Table 1. For results 720–760, all parameters used were those listed in Table 1 except for the parameters noted in the following description. For result 720, the $SiH_4$ flow rate was increased to 45 sccm (decreasing the $WF_6$:$SiH_4$ ratio to approximately 9:1). Depositing the nucleation layer long enough to achieve a 600 Å thickness (approximately 12 seconds at 350° C.) gave result ,730. For result 740, the pressure used for both the nucleation and bulk deposition was 60 Torr. For result 750, the pressure for nucleation layer deposition was raised to 60 Torr but was reduced to 40 Torr for subsequent deposition of the bulk layers. For result 760, which has the highest reflectivity and therefore the smallest grain size, the temperature of the substrate for deposition of the nucleation layer was 400° C. while the substrate temperature was 350° C. for deposition of the bulk layers. The nucleation layer was 530 Å thick.

Reflectivity is inversely proportional to grain size, therefore the higher values of reflectivity for 720–760 as compared to 710 indicate that films 720–760 have a smaller grain size than film 710. In particular, film 760 has the smallest grain size. Films 720–760 have a mean grain size of less than approximately 145 nm, where the grain size is the longest dimension of the grain. Reflectivity was measured using a Tencor UV-1250SE (KLA-Tencor, San Jose, Calif.) using 5 points at a 9 mm edge exclusion (relative to a bare silicon at a wavelenght of 480 nm).

Suitable CVD devices for depositing tungsten in accordance with the embodiments of the invention include, for example, the Altus™ system, manufactured by Novellus Systems, Inc. of San Jose, Calif. and the P5000, manufactured by Applied Materials, Inc. of Santa Clara, Calif. Suitable CVD devices include, for example, a chamber that can be pumped to a desired pressure. Inside the chamber there are platens, which support the substrate and can be heated to heat the substrate to the desired deposition temperature. Reaction gases for initiation, nucleation deposition, and bulk deposition are supplied through a manifold system from gas supply reservoirs. The gases enter the chamber through gas inlets, referred to as shower heads, that are located over the respective substrate platens.

The substrate is typically a silicon wafer prepared for receiving a tungsten film deposited on its surface, for instance, by the deposition of a titanium or titanium nitride film. The substrate may have a variety of device features patterned onto it, including contact and via holes to be filled by the tungsten film.

EXAMPLE

Figure 8:
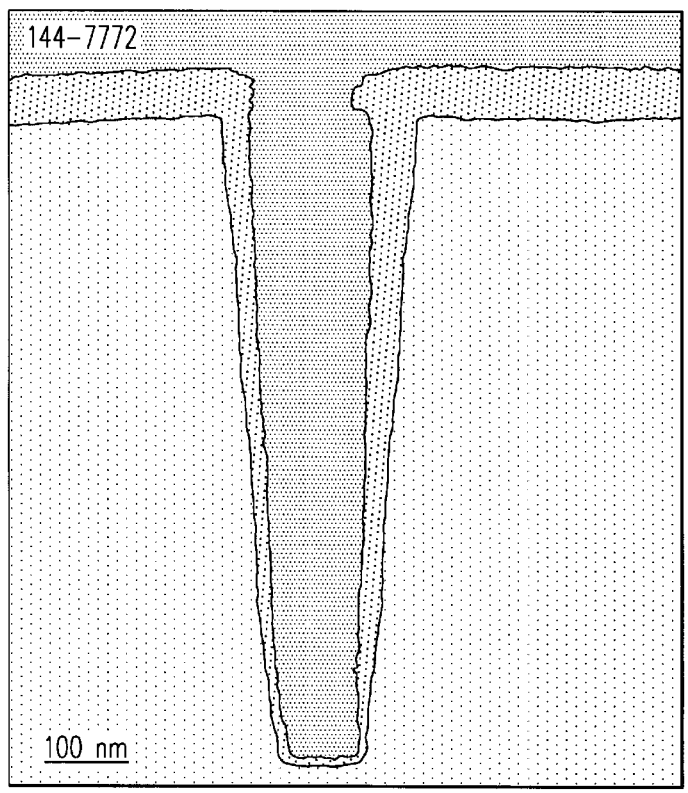
FIG. 8 is a transmission electron micrograph (TEM) photograph of a plug filled with a tungsten film deposited in accordance with the embodiments of the invention.

In an exemplary embodiment, a high aspect ratio (11.5:1) plug is filled with tungsten, illustrated in FIG. 8. An Altus™ system manufactured by Novellus Systems, Inc. of San Jose, Calif. was used. For deposition of the nucleation layer, the temperature of the first platen was 415° C. The temperature of the other platens, used for deposition of the bulk layers, was 375° C. The $SiH_4$ flow rate for nucleation layer deposition was 35 sccm (ratio of $WF_6$ to $SiH_4$ approximately 11:1). The nucleation layer was deposited for 3 seconds. Bulk layers were deposited over the nucleation layer to form a 5000 Å thick bulk tungsten film. All other process parameters used were those listed in Table 1.

As shown in FIG. 8, this deposition method fills the high aspect ratio plug without voids or seams.

The embodiments of this invention described above are illustrative and not limiting. Many additional embodiments will be apparent to persons skilled in the art from the descriptions herein, and are intended to fall within the scope of the appended claims.

What is claimed is:

1. A method for depositing a tungsten film having a mean grain size less than 145 nm onto a surface of a substrate, the method comprising:

depositing a tungsten nucleation layer having a mean nuclei size less than 100 nm; and depositing a tungsten bulk layer over the tungsten nucleation layer;

wherein the mean nuclei size of the tungsten nucleation layer controls the mean grain size of the tungsten film.

2. The method of claim 1, wherein depositing the tungsten nucleation layer comprises:

positioning said substrate within a deposition chamber;

pumping said chamber to a first pressure;

heating said substrate to a first temperature; and introducing nucleation gases into said chamber at a first ratio to deposit the tungsten nucleation layer to a first thickness.

3. The method of claim 2, wherein said first temperature is greater than 400° C.

4. The method of claim 2, wherein said first pressure is in the range of 40 Torr to 80 Torr.

5. The method of claim 2, wherein said nucleation gases comprises $WF_6$ and $SiH_4$ said first ratio is $WF_6$:$SiH_4$ and is in the range of about 1:1 to 17:1.

6. The method of claim 2, wherein said first thickness is less than 600 Å.

7. A process for depositing a tungsten film on a substrate comprising the acts of:

positioning said substrate within a deposition chamber;

heating said substrate to a first temperature greater than 400° C;

introducing nucleation gases into said chamber, to deposit a first layer of tungsten on a surface of said substrate to a first thickness;

heating said semiconductor substrate having said first layer to a second temperature less than 400° C.; and introducing bulk deposition gases into said chamber, wherein a second layer of tungsten is deposited on said first layer of tungsten.

8. The process of claim 7, wherein said first thickness is less than about 600 Å.

9. The process of claim 7, wherein said first thickness is in the range of 150 Å to 530 Å.

10. The process of claim 7, wherein said first temperature is about equal to or greater than 415° C.

11. The process of claim 10, wherein said second temperature is about equal to or less than 375° C.

12. The process of claim 7, wherein said nucleation gases comprise $WF_6$ and $SiH_4$.

13. The process of claim 12, wherein said nucleation gases are introduced into said chamber with a ratio $WF_6$:$SiH_4$ in the range of about 1:1 to 17:1.

14. The process of claim 7 further comprising the act of:

maintaining a total pressure in said deposition chamber between about 40 and about 80 Torr during deposition of said first layer.

15. The process of claim 7 further comprising the act of:

maintaining the total pressure in said deposition chamber to about equal to or greater than 60 Torr during deposition of said first layer.

16. The process of claim 7, wherein said substrate comprises a semiconductor wafer.

17. The process of claim 7, wherein said bulk deposition gases comprise $WF_6$ and $H_2$.

* * * * *